United States Patent
Ishihara et al.

(10) Patent No.: US 6,178,580 B1
(45) Date of Patent: Jan. 30, 2001

(54) PROCESSING APPARATUS

(75) Inventors: Akira Ishihara, Tosu; Kazuyoshi Namba, Hachioji; Akira Yonemizu; Takanori Miyazaki, both of Kumamoto, all of (JP)

(73) Assignee: Tokyo Electron Limited (JP)

( * ) Notice: Under 35 U.S.C. 154(b), the term of this patent shall be extended for 0 days.

(21) Appl. No.: 09/299,628

(22) Filed: Apr. 27, 1999

(30) Foreign Application Priority Data

Apr. 28, 1998 (JP) .................................................. 10-134312

(51) Int. Cl.⁷ .................................................. A46B 13/04
(52) U.S. Cl. .................................................. 15/77; 15/102
(58) Field of Search .................. 15/77, 88.2, 97.1, 15/102

(56) References Cited

U.S. PATENT DOCUMENTS

| | | | |
|---|---|---|---|
| 4,382,308 | * 5/1983 | Curcio ....................................... | 15/77 |
| 4,935,981 | * 6/1990 | Ohtani et al. ........................... | 15/88.2 |
| 5,351,360 | * 10/1994 | Suzuki et al. .............................. | 15/77 |
| 5,636,401 | * 6/1997 | Yonemizu et al. ....................... | 15/77 |
| 5,829,087 | * 11/1998 | Nishimura et al. .................... | 15/88.2 |
| 5,858,112 | * 1/1999 | Yonemizu et al. ....................... | 15/77 |
| 5,860,178 | * 1/1999 | Nishimura et al. ....................... | 15/77 |
| 5,943,726 | * 8/1999 | Eitoku et al. .......................... | 15/88.2 |
| 5,947,134 | * 9/1999 | Kim et al. ................................. | 15/77 |

FOREIGN PATENT DOCUMENTS 8-243518   9/1996  (JP) .

* cited by examiner

Primary Examiner—Terrence R. Till
(74) Attorney, Agent, or Firm—Smith, Gambrell & Russell, LLP

(57) ABSTRACT

A drive unit 42 for driving a brush 8 is provided on a tip of a rotatable arm 26. The drive unit 42 includes a motor 61 for driving the processing member 24 having a brush 58 for rotation and an adjustment mechanism 45 for adjusting a force to urge the processing member 24 against a wafer W. With no intermediary of a flexible transmitting means, such as a belt, the processing member 24 is securely joined to the motor 61 through a shaft 55 and driven by the motor 61 directly. The adjustment mechanism 45 is constituted by an electromagnetic actuator which includes a stationary element 46 and a movable element 48 capable of elevating along the stationary element 46. The motor 61 is coupled to the armature 48. The adjustment mechanism 45 controls the position of the processing member 24 with respect to the upward and downward direction as well as the force to urge the processing member 24 against a wafer W.

16 Claims, 12 Drawing Sheets

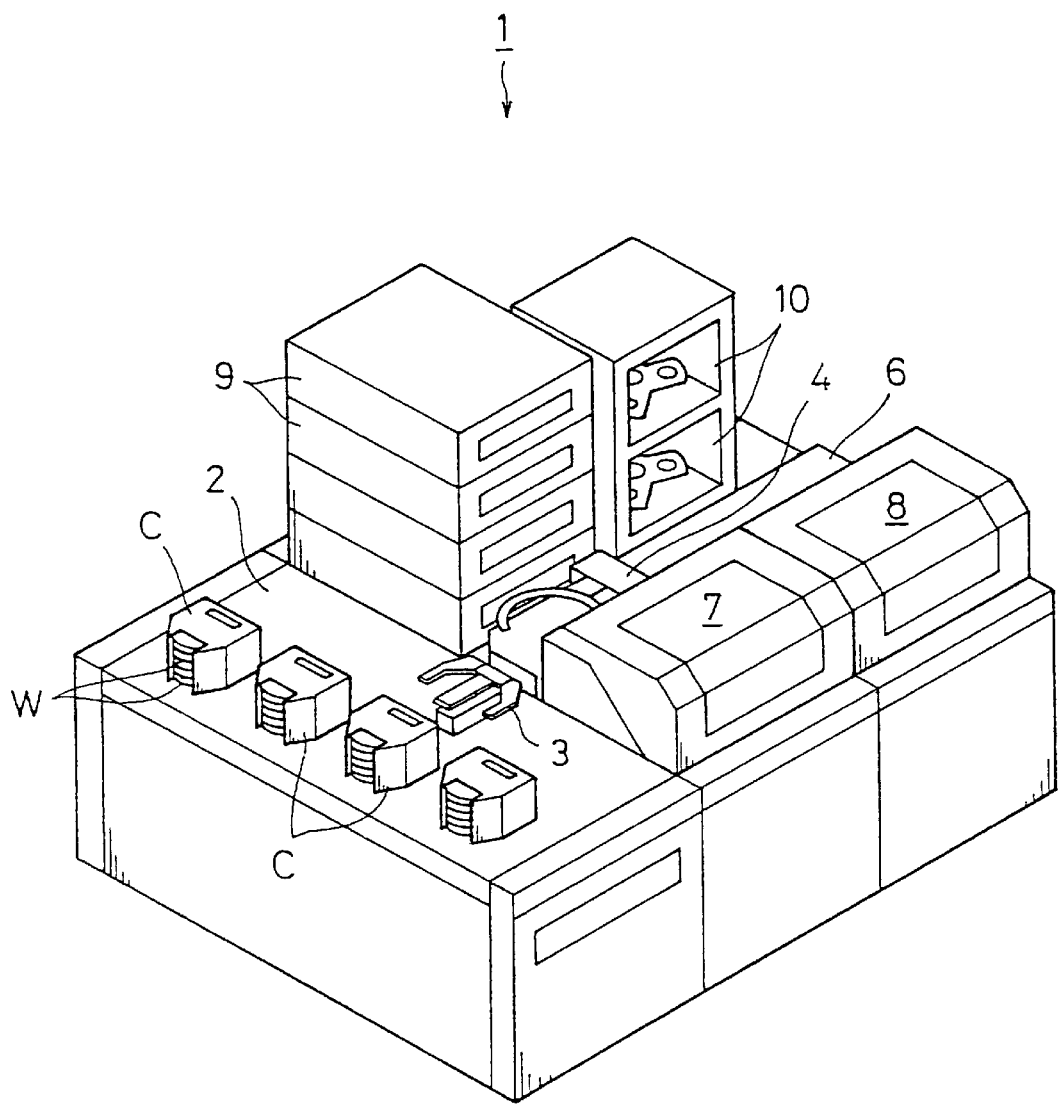
F I G. 1

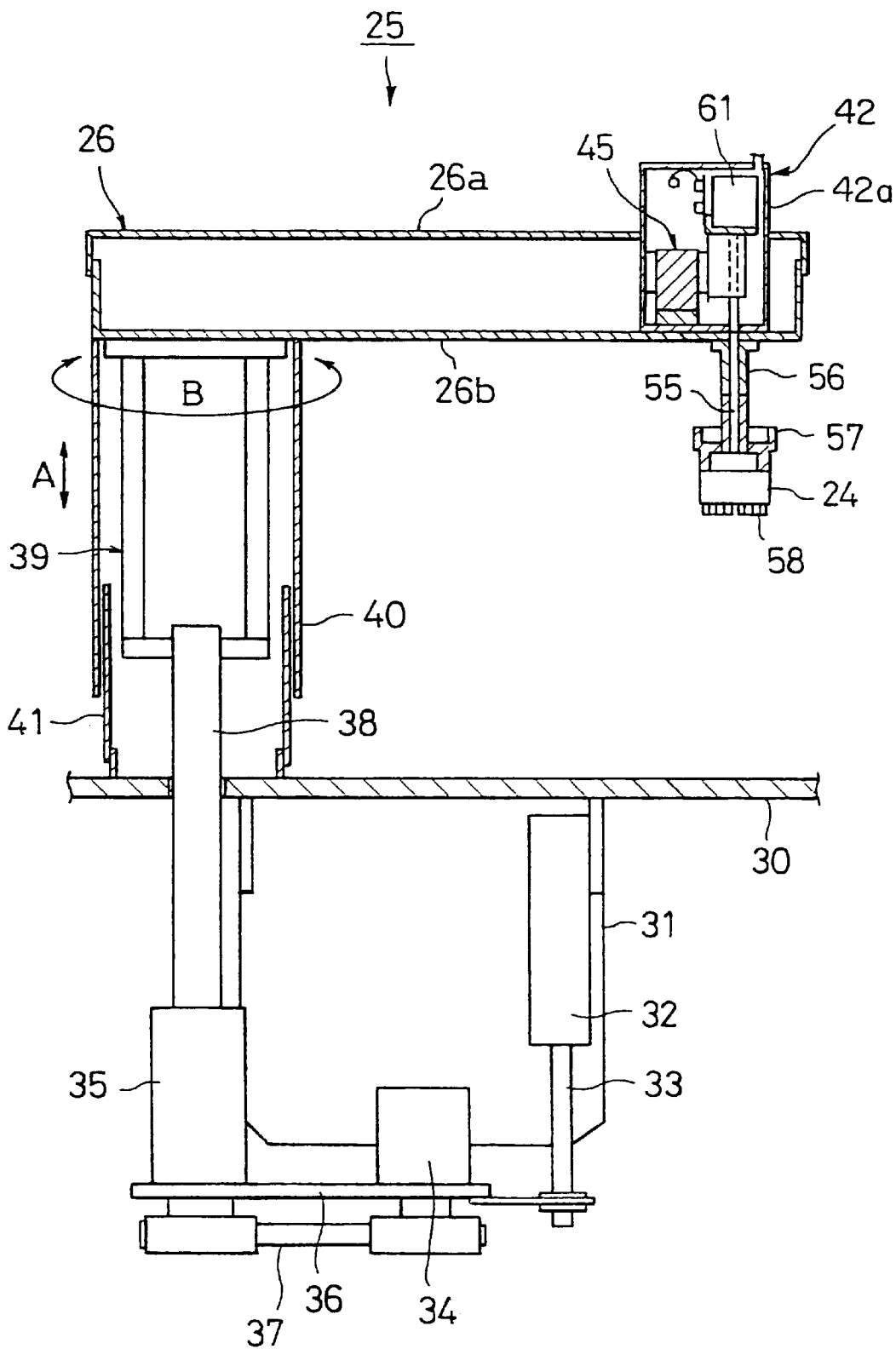
F I G. 4

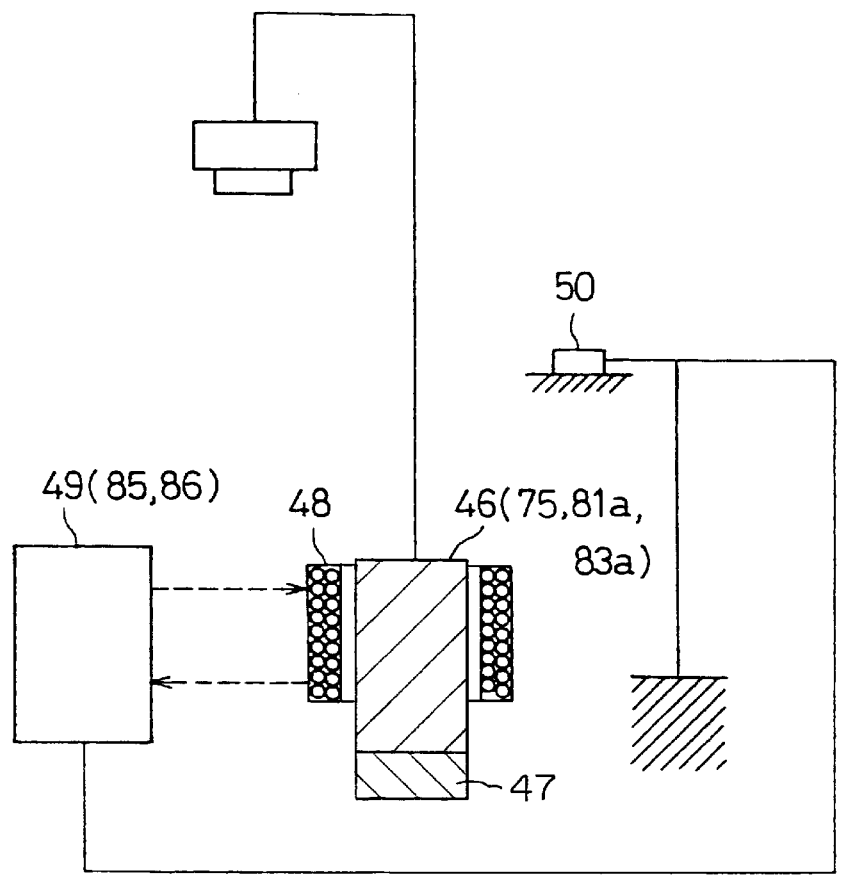
F I G. 9
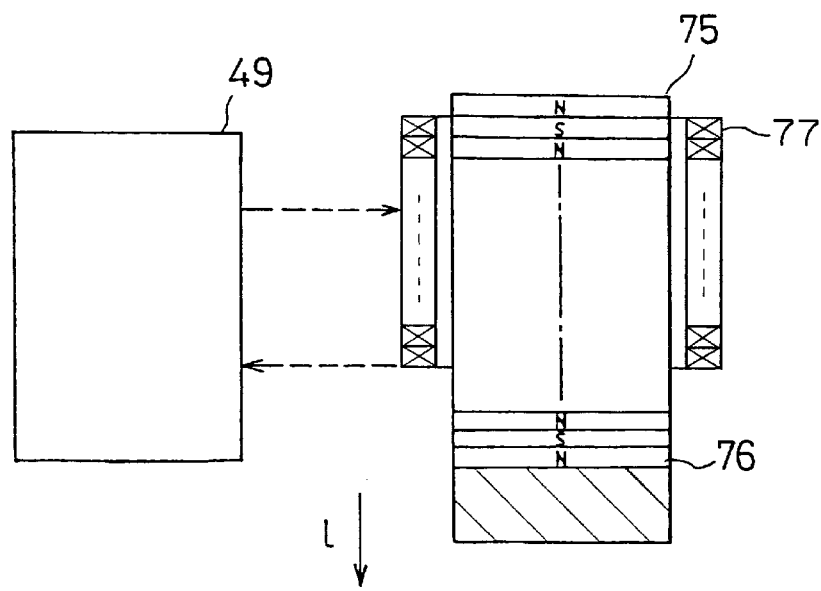
F I G. 10

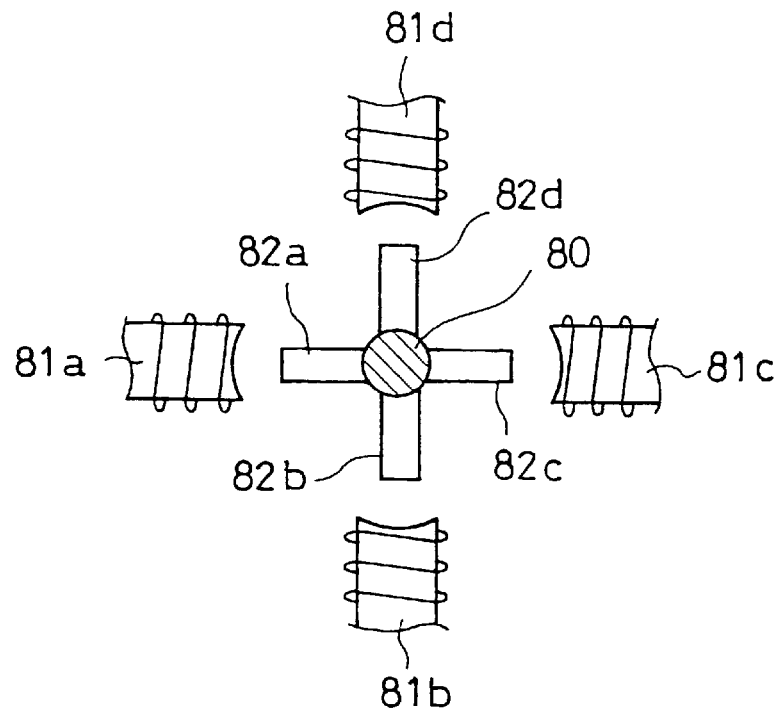
F I G. 12
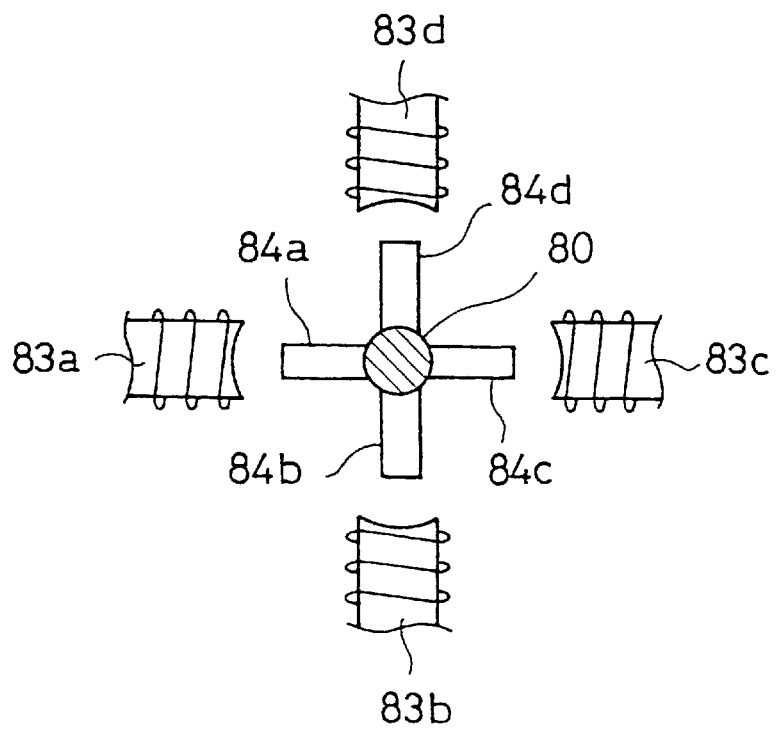
F I G. 13

PROCESSING APPARATUS

BACKGROUND OF THE INVENTION

1. Technical Field of the Invention

The present invention relates to a processing apparatus for applying a designated treatment on substrates to be processed, for example, semiconductor wafers, LCD (liquid crystal display) glass substrates, or the like.

2. Description of the Related Art

Generally, in the manufacturing process for semiconductor devices, a cleaning systems is employed in order to remove various contamination adhering to surfaces of the semiconductor wafers, for example, particles, organic contaminants, metal impurities, or the like. A single wafer processing system on behalf of the cleaning system is generally provided with a spin cleaning apparatus.

As an example, there is known a processing apparatus equipped with a scrubber, disclosed in Japanese Unexamined Patent Publication No. 8-243518. A scrubbing in this field means scouring off particles etc. from to the surfaces of the wafers by contacting a rotational processing member having a member, such as brush or sponge, with the surfaces of the wafers while rotating the unit. This conventional processing apparatus includes an elevating and rotating arm provided, at a tip thereof, with a power source in various forms, i.e. air cylinder, actuator, etc. Arranged below such a power source is an elevating and rotating shaft having its lower end to which cleaning gear, i.e. the processing member is attached.

When the power source is activated to apply up-and down thrust on the shaft, then the thrust acts on the processing member, so that it does press the surface of the wafer. The total amount of the thrust acting on the processing member and its weight is equivalent to contact pressure (i.e. pressure per unit area) applied on the wafer by the processing member. In order to clean the surfaces of the wafers favorably, it is important to control the contact pressure within a designated range and rotate the processing member at predetermined revolutions.

In the conventional processing apparatus, a rotating mechanism for rotating the processing member comprises a motor arranged in a position apart from the shaft, for example a base part of an arm member, a driving pulley rotatably secured to the motor, a driven pulley secured on the vicinity of a top of the shaft and a belt wound on both driving pulley and driven pulley. On rotation of the motor, the rotation is transmitted from the belt to the shaft, so that the processing member does revolve.

In the conventional processing apparatus, however, an establishment space for setting a rotating mechanism carrying such power-transmitting components as the belt, the pulleys, etc. extends from the tip of the arm member to the base part. Therefore, the apparatus has problems that the arm is large-sized and the interior structure of the arm is complicated. Additionally, the belt's rotation over the driving pulley and the driven pulley causes the belt and both pulleys to be rubbed to make dust. If the dust diffuses around, it may cause the sticking of particles onto the wafers, so that the efficiency of cleaning may be reduced.

Furthermore, in the conventional processing apparatus, there is a high probability that tension of the belt is exerted on the shaft through the driven pulley thereby to exert a bad influence on the elevation and rotation of the shaft. Additionally, depending on the circumstances, it happens that the transmission loss is caused due to the belt's loosing.

Accordingly, there is a case that the shaft insecurely operates during the cleaning process and therefore, it is not always easy to control both contact pressure and rotation of the processing member.

SUMMARY OF THE INVENTION

Accordingly, it is therefore an object of the present invention to simplify a mechanism for transmitting the driving force from the rotating motor to the processing member in order to control both rotation of the processing member and contact pressure thereof with the object to be processed appropriately.

According to the first aspect of the invention, the object of the present invention described above can be accomplished by a processing apparatus which includes: an arm member; a processing member for applying a designated treatment on a substrate; and a drive unit fixed to the arm member for driving the processing member, the drive unit including a motor for driving the processing member for rotation about a predetermined axis as a rotating center and a adjustment mechanism for controlling a forth exerted on the substrate by the processing member, wherein the motor and the adjustment mechanism are disposed adjacent each other.

According to the second aspect of the invention, the object of the present invention described above can be also accomplished by another processing apparatus which includes: a processing member for applying a designated treatment on a substrate; a motor for driving the processing member for rotation about a predetermined axis as a rotating center; and a adjustment mechanism for controlling a forth exerted on the substrate by the processing member; wherein the motor and the adjustment mechanism are combined with each other.

According to the third aspect of the invention, the object of the present invention described above can be also accomplished by another processing apparatus which includes: a processing member for applying a designated treatment on the substrate; and a drive unit for driving the processing member, the drive unit including: a drive shaft for rotating the processing member, the drive shaft being movable upward and downward; first magnets secured on the drive shaft; second magnets secured on the drive shaft; first electromagnets arranged in the vicinity of the first magnets, for maintaining the drive shaft at a predetermined height due to electromagnetic force acting between the first magnet and the first electromagnet; and second electromagnets arranged in the vicinity of the second magnet, for moving the drive shaft in an axial direction thereof due to electromagnetic force acting between the second magnets and the second electromagnet.

According to the fourth aspect of the invention, the object of the present invention described above can be also accomplished by another processing apparatus which includes: a processing member for applying a designated treatment on the substrate; a motor for rotationally driving the processing member; a shaft for connecting the motor to the processing member; elevating means for moving up and down the processing member, the motor and the shaft together.

BRIEF DESCRIPTION OF THE DRAWINGS

FIG. 1 is a perspective view of a cleaning system equipped with a surface treatment device according to the present invention;

FIG. 4 is a view of longitudinal section of a scrub cleaner installed in the surface treatment device of FIGS. 2 and 3;

FIG. 9 is a circuit diagram for explanation of a structure where the power control unit sends an electric current to the elevating coil;

FIG. 10 is an explanatory diagram of another example of a magnetic field generator;

FIG. 12 is a cross-sectional view taken along a line III—III of FIG. 11;

FIG. 13 is a cross-sectional view taken along a line IV—IV of FIG. 12; and

DESCRIPTION OF THE PREFERRED EMBODIMENTS

Figure 2:
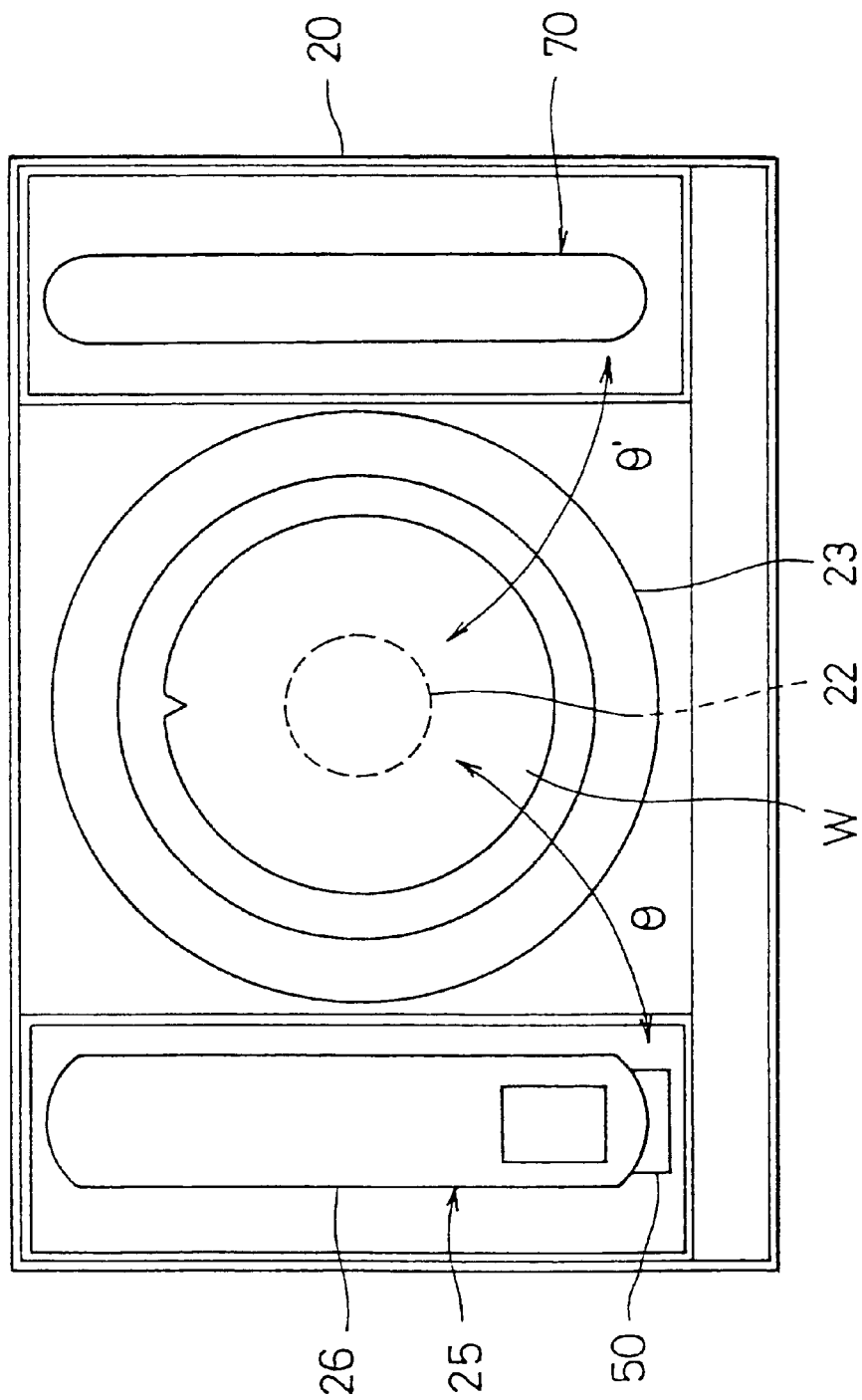
FIG. 2 is the surface treatment device according to the present invention.

Preferred embodiments of the present invention will be described by an example of a surf ace treatment device for cleaning surfaces of wafers. FIG. 1 is a perspective view of a cleaning system 1 having a built-in surface treatment device 7 of the embodiment.

Into the cleaning system 1, plural wafers W are collectively carried in the form of carriers C. In the system 1, the wafers W are cleaned and dried one by one and thereafter, they are carried out of the system 1 in the form of the carriers C.

The cleaning system 1 is provided with a mount section 2 for laying four carriers C each accommodating the wafers W therein. Arranged at the center of the cleaning system 1 is a wafer arm 3 which can take the single wafer W before cleaning out of the carrier C mounted on the mount section 2 and which can put the cleaned wafer W back in the carrier C. On the back of the wafer arm 3, a transfer arm 4 constituting a transfer mechanism is standing ready for transferring the wafer W to and from the wafer arm 3. The transfer arm 4 is adapted so as to move along a transfer path 6 running through the middle of the cleaning system 1. A variety of processing devices are arranged on both sides of the transfer path 6. In detail, on one side of the transfer path 6, a front-surface treatment device 7 for washing the front of the wafer W and a back-surface treatment device 8 for washing the back of the wafer W are arranged side by side. While, four heating devices 9 are piled up on the other side of the transfer path 6. The heating devices 9 provide means for heating the wafer W to dry. Adjacent to the heating devices 9, two wafer turn-over devices 10 are also stacked.

Figure 3:
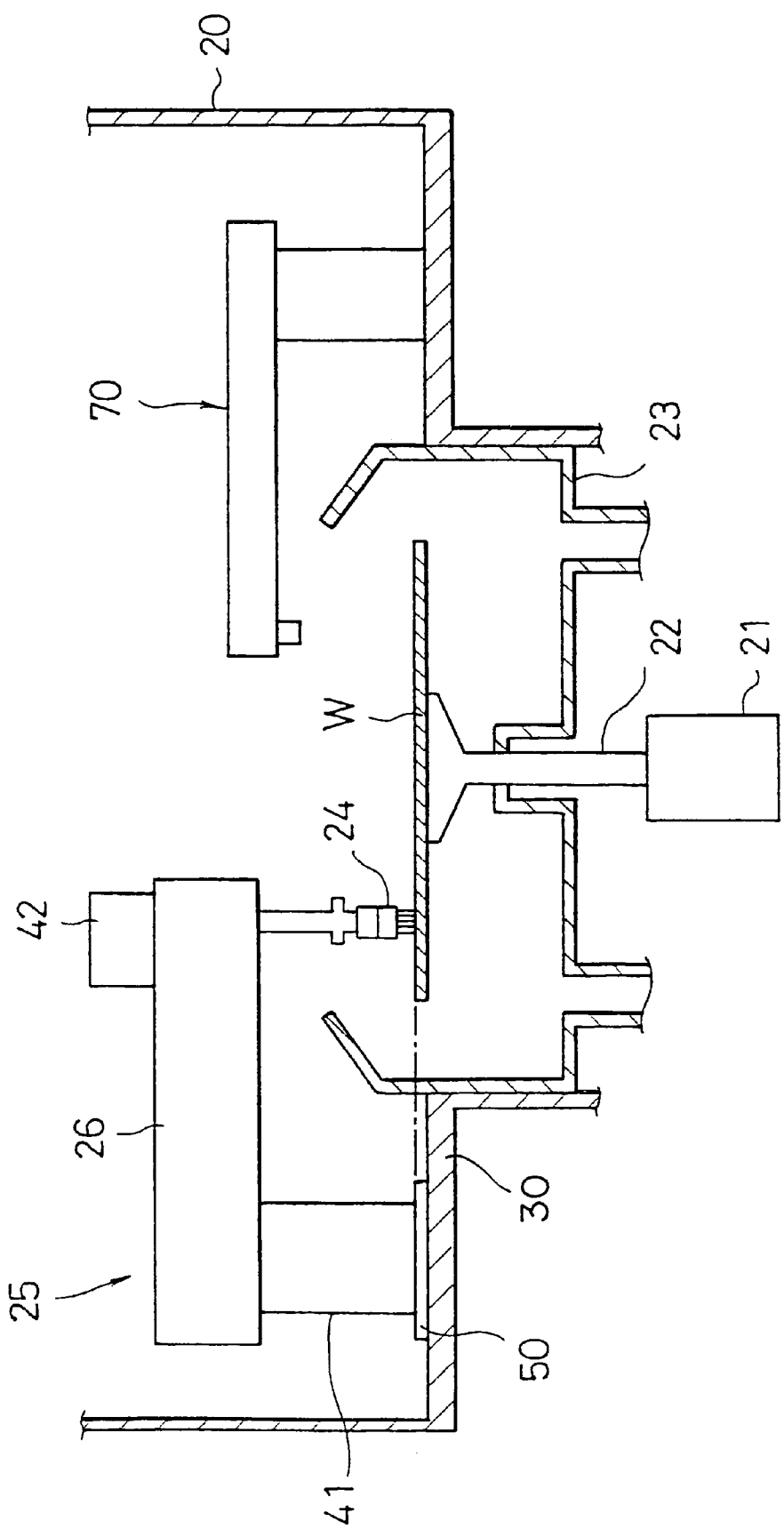
FIG. 3 is a view of longitudinal section of the surface treatment device of FIG. 2.

Next, the structure of the surface treatment device 7 is described. FIG. 2 is a plan view showing an interior of the surface treatment device 7, while FIG. 3 is a side view of the device 7.

The surface treatment device 7 has a spin chuck 22 arranged at a substantial center of the interior of a casing 20.

The spin chuck 22 while attracting the wafer W horizontally is driven for rotation by a motor 21. Around the spin chuck 22, a cup 23 is provided for surrounding the spin chuck 22 and the wafer W in order to prevent treatment liquids applied on the surface of the wafer W from dispersing to the circumference. Note, as carrier means besides the spin chuck 22, it may be replaced with a mechanical chuck allowing the wafer to be horizontally held by means of claws, rings, or the like.

On one side of the casing 20, a scrubber (scrub cleaning device) 25 is disposed for cleaning the wafer W while contacting a processing member 24 with the surface of the wafer W. The processing member 24 has, on a lower face thereof, a cleaning element 58, such as a brush, a sponge, or the like, for cleaning the surface of the wafer W. Depending on an object to be cleaned, the element 58 may be appropriately selected from a hard brush, for example, a nylon brush with hard hairs, and a soft brush, for example, a mohair brush with soft hairs.

On the other side of the casing 20, the surface treatment device 7 is provided with a pure water supply nozzle 70 which is capable of reciprocating in a direction θ' in FIG. 2, on the symmetrical side of the scrubber 25 over the spin chuck 22.

A mechanism for operating an arm member 26 of the scrubber 25 will be described hereinafter. As shown in FIG. 4, a bracket 31 is fixed on an underside face of a base 30 of the casing 20. A cylinder 32 is attached to the bracket 31. The cylinder 32 is provided with a rod 33 for carrying a support plate 36. A motor 34 and a bearing 35 for bearing a shaft 38 are attached on the upper face of the support plate 36. Respective pulleys are secured on an output shaft of the motor 34 and also the shaft 38. The rotation of the motor 34 is transmitted to the shaft 38 through the intermediary of a belt 37 bridging both pulleys.

The shaft 38 penetrates through a hole formed in the base 30, a diameter of the hole being larger than the outside diameter of shaft 38, and extends upward. A support column 39 is provided with a lower end fixed on a top end of the shaft 38. The upper end of the column 39 is secured on the base end of the arm member 26.

The circumferences of the shaft 38 and the support column 39 are covered with a cylindrical cover 40 attached on the underside of the base end of the arm member 26. Inserted into a lower portion of the cover 40 is a cylindrical cover 41, which is fixed on the base 30.

When driving the rod 33 of the cylinder 31 to go forward or backward, then the movement is transmitted to the support column 39 via the support plate 36, the bearing 35 and the shaft 38 in order, thereby allowing the arm member 26 to move up or down (in the direction of arrow A in FIG. 4). On the other hand, when driving the motor 34, the rotational movement is transmitted to the support column 39 via the belt 37 and the shaft 38, thereby allowing the arm member 26 to swivel (in the direction of arrow B in FIG. 4).

Figure 5:
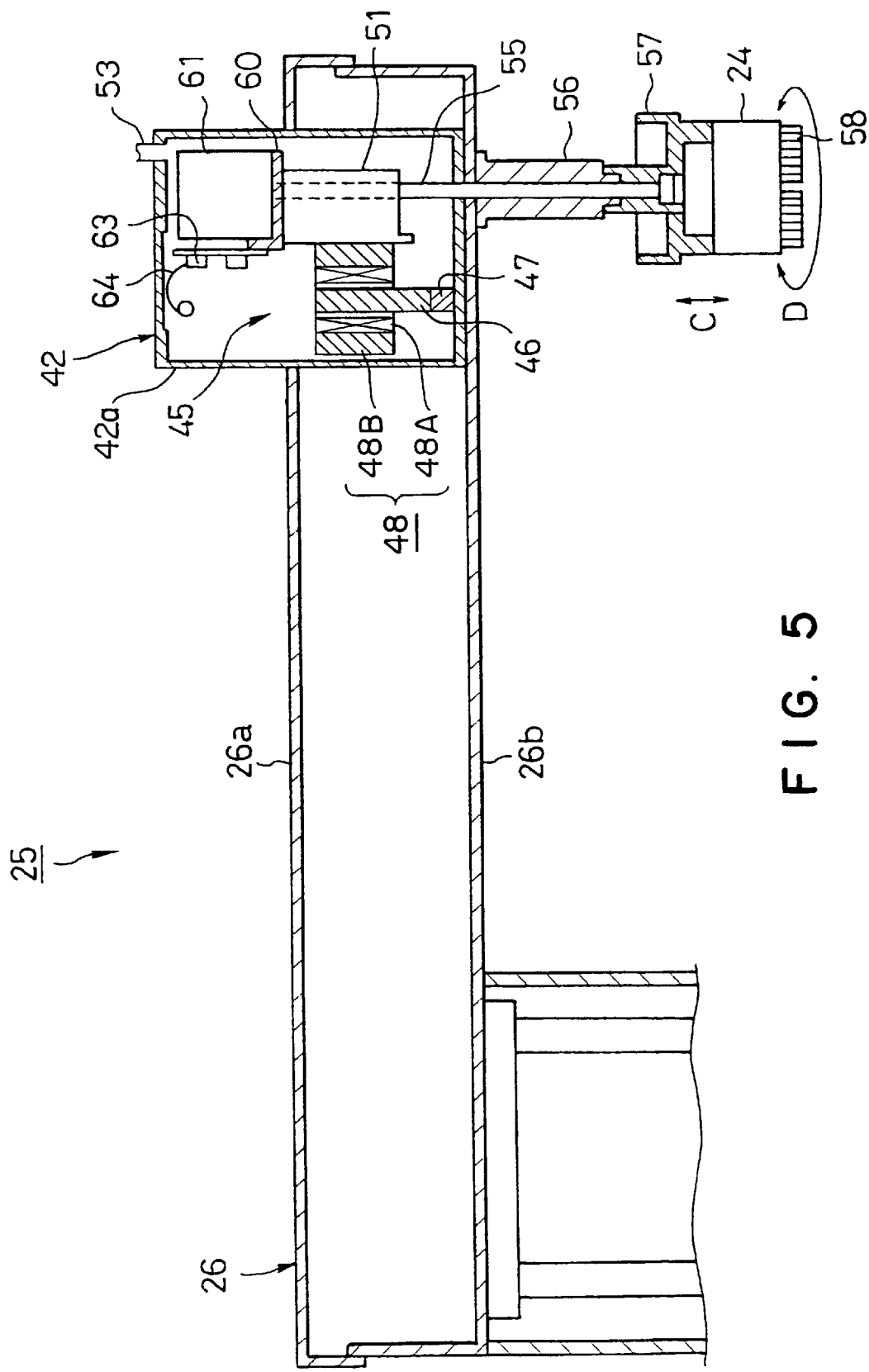
FIG. 5 is a view of longitudinal section of an arm member of the scrub cleaner of FIG. 4.

As the enlargement shows in FIG. 5, the arm member 26 has a frame 26b and a cover 26a for covering it. It should be noted that the arm member 28 is provided, on the base end, with no complicated power-transmitting components for rotating the processing member 25 arranged at the distal end of the arm member 26. These components have been arranged in the conventional apparatus and composed of a motor, a driven pulley and a belt for transmitting the rotation to the processing member (24), etc. That is, the arm member 26 of the embodiment is provided with a hollow part extending from at least the proximal end to the intermediate portion thereof. Accordingly, during the operation of the scrubber 25, any dust due to friction among such power-transmitting components is not produced in the arm member 26.

At the distal end of the arm member 26, a drive unit 42 is fixed on the frame 26b so as to project from the cover 26a. In this way, since the structure of the arm member 26 is remarkably simple and compact, the manufacturing of the member 26 is accomplished by only joining the frame 26b, the cover 26a and the drive unit 42 together.

Figure 6:
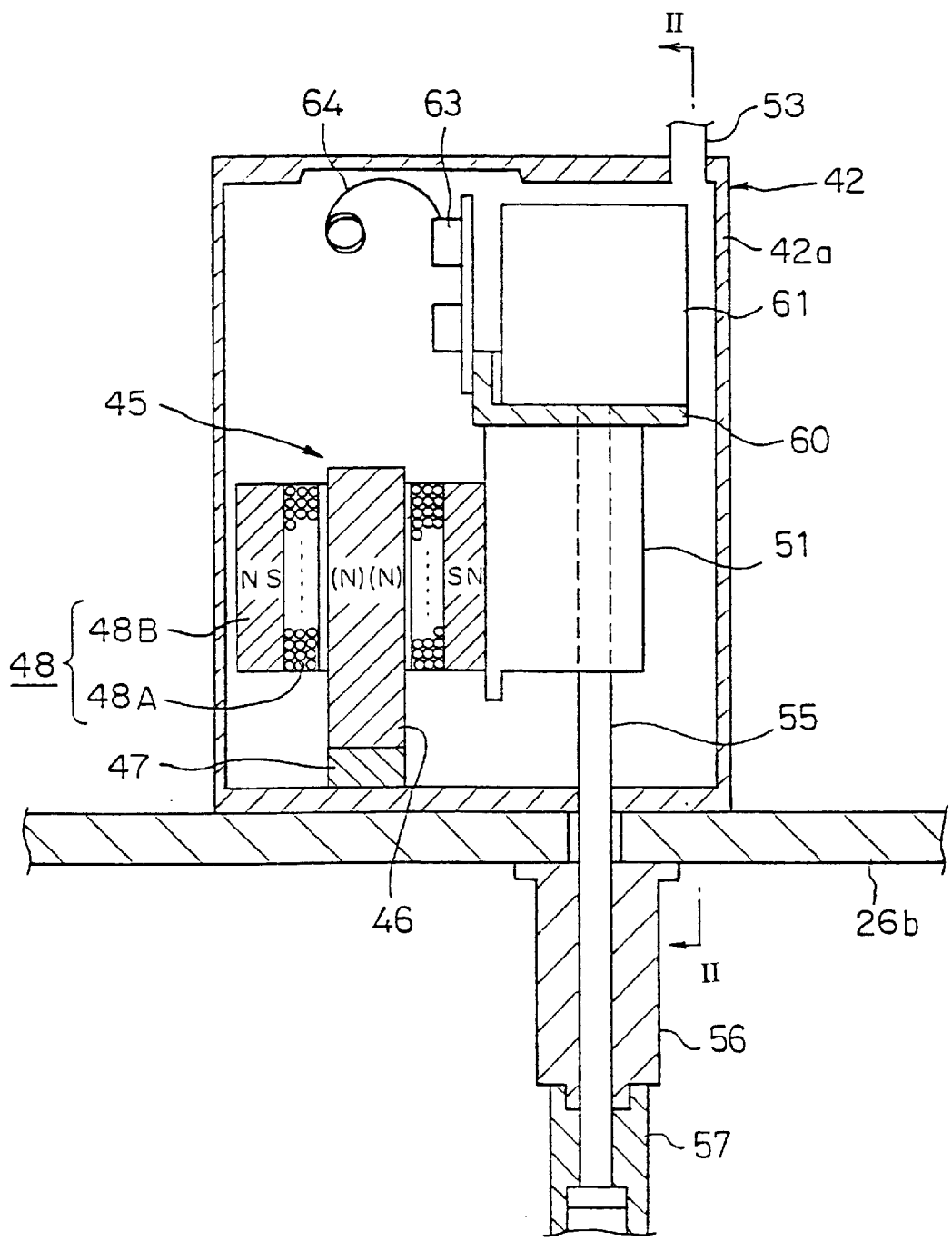
FIG. 6 is a view of longitudinal section of a driving unit of FIG. 5.
Figure 7:
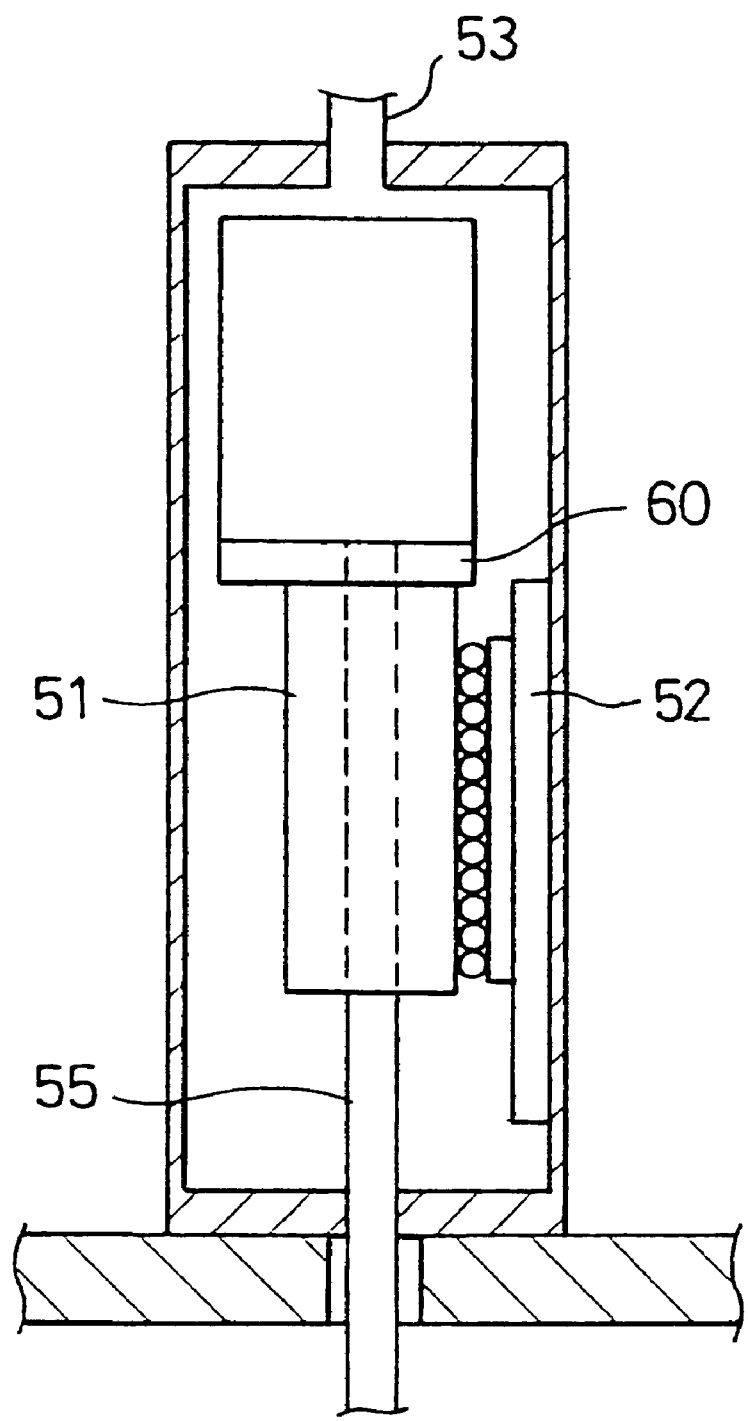
FIG. 7 is a view of longitudinal section, taken along a line E—E of FIG. 6.

FIG. 6 is a longitudinal sectional view of the drive unit 42 and FIG. 7 is a cross sectional view taken along a line II—II of FIG. 6. The drive unit 42 includes a case 42a for enclosing an interior mechanism of the unit 42. The case 42a of the drive unit 42 has a top wall connected with an exhaust pipe line 53 for discharging the atmosphere in the case 42a. Therefore, the dust in the case 42a is discharged out of the device through the exhaust pipe line 53, thereby avoiding the dust's diffusing to the circumference.

An adjustment mechanism 45 is disposed in the case 42a. The adjustment mechanism 45 controls the force urged by the processing member 24 to the substrate. The adjustment mechanism 45 is constituted by an electromagnetic linear actuator consisting of a stationary element 46 made of a magnetic substance and a movable element 48. The stationary element 46 has a shape of circular cylinder. The movable element 48 comprises a ring-shaped coil 48A and a permanent magnet 48B disposed outside of the coil 48A. The stationary element 46 extends vertically and is fixedly mounted on table 47 fixed on the bottom of the casing 42a. The stationary element 46 is inserted into the movable element 48 defining a gap therebetween. The coil 48A is connected to a power control unit 49 for supplying electrical current to the coil 48A and controlling the current.

By the permanent magnet 48B, a pole is induced on the stationary element 46. When the coil 48A is energized, conducting wires of coil 48A is effected by a magnetic field, which is produced by the pole induced on the stationary element 46, thereby vertical thrust for moving the coil 48A is produced. By controlling electrical current flowing from the power control unit 49 to the coil 48A, the vertical thrust of the coil 48A can be controlled.

An elevating body 51 is fixed on the movable element 48. As shown in FIG. 7, the back face of the elevating body 51 comes in contact with a ball slider mechanism 52 fixed on the drive unit 42, so that the elevating body 51 is capable of elevating along the ball slider mechanism 52.

A motor 61 is fixed to the elevating body 51 via a bracket 60 fixed thereto. A shaft 55 is fixed to an output shaft of the motor 61. Alternatively, the output shaft of the motor 61 itself may constitute the shaft 55. The shaft 55 penetrates through the elevating body 51 for rotation. A lower portion of the shaft 55 penetrate through the casing 42a of the drive unit 42 and the frame 26b of the arm member 26, and projected downward below the arm member 26. Arranged about a periphery of the projecting portion of the shaft 55 is a protection cover 56, which has an upper end fixed on the arm member 26. The processing member 24 is detachably mounted on a lower end of the shaft 55 via an attachment 57.

Thus, with the rising and falling movement of the movable element 48 of the adjustment mechanism 45, the processing member 24 can move upward and downward (the direction of arrow C in FIG. 5). The processing member 24 is directly driven by the motor 61.

In order to drive the motor 61 electrically, wires 64 are connected to respective terminals 63 of the motor 61. The wires 64 are bundled on the upside of the case 42a of the drive unit 42 so as not to disturb the elevating movements of the motor 61 and the elevating body 51.

As shown in FIGS. 2 and 3, a pressure sensor 50 is provided on the one side of the casing 20, in addition to the scrubber 25. The pressure sensor 50 is spaced apart from the wafer W. The pressure sensor 50 is positioned right below the processing member 24, when the arm member 26 of the scrubber 25 is in a stand-by position (i.e., a position as shown in FIG. 2).

The relationship between current supplied to the coil 48A and pressure against the pressure sensor 50 loaded by the processing member 24 is obtained, by monitoring the pressure while varying current supplied to the coil 48A. Such calibration is executed when the scrub cleaning operation is not executed and the scrubber 25 is in the stand-by position. Then, the relationship is stored in the power control unit 49. The sensing surface of the pressure sensor 50 is on a level with a height of the surface of the wafer W held by the spin chuck 22. Thereby, such a situation as the processing member 24 actually contacting with the surface of the wafer W reappears faithfully, and an accurate calibration can be done. Then, on the actual stage of scrubbing, the power control unit 49 flows designated current through the coil 48A on the basis of the data on memory.

Depending on the kind (i.e. contents) of cleaning process, the current applied to the elevating coil 48 is altered to change the contact pressure of the processing member 24 on the wafer W appropriately. That is:

(i) on one occasion, downward thrust is produced by the adjustment mechanism 45, so that the sum of the downward thrust and the weight of the processing member 24 and the component connected thereto amounts to a designated contact pressure;

(ii) Alternatively, on another occasion, upward thrust is produced by the adjustment mechanism 45 while maintaining the processing member 24 contacting with the wafer W, so that the difference between the upward thrust and the weight of processing member 24 and the component connected thereto is equal to a designated contact pressure less than 60 gf, for example.

The cleaning system 1 of the embodiment operates as follows. First of all, a not-shown transfer robot puts the carrier C having the wafers W (e.g. 25 pcs. before cleaning) accommodated therein on the mount section 2. Then, the wafers W in the carrier C are taken out one by one and delivered to the transfer arm 4 through the wafer arm 3. Next, by using the front surface treatment device 7 and the back surface treatment device 8, the wafers W are washed one by one, so that the organic contaminants, the particles, etc. adhering to each surface of the wafers W are eliminated. Thereafter, the wafer W after cleaning is continuously dried by the heating device 9. After completing the designated processes, then the wafer W is delivered from the transfer arm 4 to the wafer arm 3 and sequentially, the wafer W is accommodated in the carrier C, again.

Hereto, we describe the steps of cleaning process executed in the surface treatment device 7. First, the wafer W is brought into the surface treatment device 7. In the device 7, the wafer W is firstly carried by the spin chuck 22 and then it begins to rotate. While, in the scrubber 25 in the "stand-by" mode, the arm member 26 is rotated by the cylinder 32 and the motor 34, so that the processing member 24 is moved to the upside of the wafer W, for example, the vicinity of the center of the wafer W.

Next, the processing member 24 is rotated by the motor 61 at designated revolutions. Then, the processing member 24 is lowered by the cylinder 32. Further, current is supplied to the coil 48A, and the forth exerted on the wafer W by the processing member 24 is controlled. For example, upward thrust is produced so that a designated contact pressure, e.g.,less than 60 gf, is loaded on the wafer W. Under such a situation, the arm member 26 is rotated from at least the center of the wafer W up to the periphery, so that the whole surface of the wafer W is cleaned uniformly. While, the pure water supply nozzle 70 is shifted to the upside of the wafer W to supply the pure water on the surface of the wafer W. Note, depending on the kind of wafers W as the objects being cleaned, the modified scrubbing may be adopted on condition that the processing member contacting the wafer W is not rotated.

After the designated period has passed, the scrubbing and sequent rinsing using the pure wafer are completed. Then, the processing member 24 is withdrawn from the upside of the wafer W by the cylinder 32 and the motor 34. The pure water supply nozzle 70 is also withdrawn from the surface of the wafer W to the original position. Thereafter, the remaining wafers W are continuously supplied to the surface treatment device 7 and subjected to the above-mentioned cleaning process in order. In this way, when the processed wafers W (e.g. 25 pcs.) are accommodated in the carrier C on completion of the application of designated process on the wafers W, they are discharged out of the cleaning system 1 every carrier C.

In this embodiment, the drive unit 42 where the adjustment mechanism 45 and the motor 61 are accommodated is attached to the arm member 26, while the motor 61 and the processing member 24 coupled thereto through the shaft 55 are adapted so as to move up and down by the adjustment mechanism 45. Therefore, the motor 61, the field generator 46 and the coil 48A can be arranged close to each other. Consequently, the structure of the arm member 26 can be simplified and small-sized in comparison with the conventional arm member, so that it is possible to reduce the number of components and also the burden on a worker(s) in assembling the scrubber 25.

Further, according to the embodiment, the drive unit 42 and the processing member 24 are together disposed in the distal end of the arm member 26, so that the rotation of the motor 61 is directly transmitted to the processing member 24. Thus, since there is no need to arranged the power-transmitting components, such as belt, pulleys, etc., between the motor 61 and the processing member 24, any dust due to friction among such power-transmitting components does not stick to the surface of the wafer W. produced in the arm member 26. Additionally, there is no produced any rotational disturbance of the processing member 24 derived from the inequality in tension of belt.

Furthermore, according to the embodiment, the contact pressure of the processing member 24 is controlled on the basis of the magnitude of current flowing the coil 48A. It means that if changes the current quickly, then the thrust of the coil 48A varies correspondingly. Therefore, it is possible to change the magnitude of the contact pressure of the processing member 24 swiftly. In addition, since the current can be changed continuously, it is also possible to carry out the fine adjustment of the thrust of the elevating coil 48. It means that the contact pressure of the processing member 24 can be adjusted finely. Thus, it is possible to control the contact pressure of the processing member 24 smoothly, thereby stabilizing the contact pressure required corresponding to the sort of cleaning process, the situation, etc. Further, at the time of the initial setting or maintenance for the cleaning system 1, the contact pressure can be adjusted easily and certainly.

Figure 8:
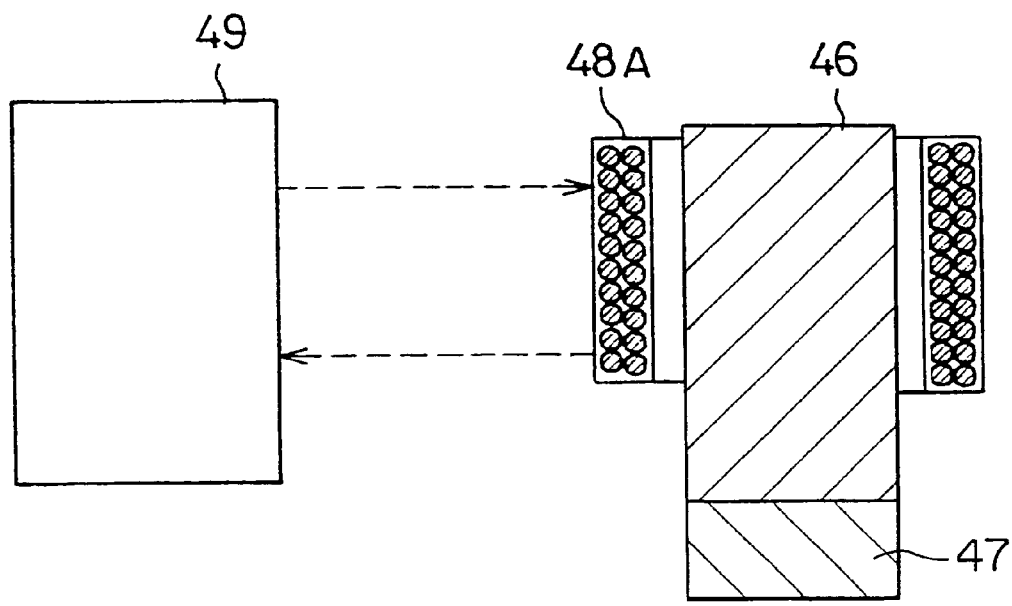
FIG. 8 is an explanatory view showing a relationship between an elevating coil and a power control unit.

The adjustment mechanism 45 of FIG. 8 may be modified into a structure shown in FIG. 10. That is, the stationary element 46 of a magnetic substance may be replaced with a stationary element 75 of a group of magnets having different polarities stacked by turns, while the coil 48A of a single coil may be replaced with plural coils 77 arranged at a pitch corresponding to a pitch of the magnets 76. In this case, the permanent magnet 48B can be omitted. In this way, when constructing the adjustment mechanism so as to have a structure corresponding to the liner synchronous motor, it is possible to rise and fall the movable element 48 in blocks of a vertical thickness of the magnet 76, whereby the height of the processing member 24 can be accurately controlled in blocks of the vertical thickness of the magnet 76.

Also in this case, as shown in FIG. 9, it is preferable to connect the pressure sensor 50 to the power control unit 49. In this case, while the scrubber 25 is in the stand-by position, the processing member 24 comes in contact with the sensing surface of the pressure sensor 50, which is established on a level with a height of the surface of the wafer W supported by the spin chuck 22. Then, the processing member 24 is lowered in order to apply the designated contact pressure on the pressure sensor 50. Next, the power control unit 49 does memorize the current data necessary to lower the elevating coil 77 by a moving distance 1 so that the height of the processing member 24 at the designated contact pressure can be revived in the practical scrubbing. In the stage of the actual scrubbing, the power control unit 49 causes the elevating coil 77 to descend by the moving distance 1 on the basis of the memorized data in order to adjust the height of the processing member 24. Then, by contacting the processing member 24 with the surface of the wafer W, the predetermined contact pressure is applied on the surface of the wafer W. In this way, it is possible to control the contact pressure of the processing member 24 smoothly.

Next, referring to FIGS. 11 to 14, we describe the second embodiment of the present invention. In this embodiment, a drive unit 79 is used in place of the drive unit 42 of the first embodiment. The drive unit 79 is adapted so as to control both height of the processing member and thrust applied thereon by the electromagnetic action. Note, in the embodiment shown in FIG. 11 to 14, elements similar to the constituents of the previously-mentioned surface treatment device 7 in view of their function and constitution are indicated with the same reference numerals respectively and therefore, their overlapping descriptions are eliminated.

The drive unit 79 includes a shaft 80. The shaft 80 has first permanent magnets 82a, 82b, 82c, 82d and second permanent magnets 84a, 84b, 84c, 84d secured on upper and lower portions of the shaft 80, respectively. Arranged around the first permanent magnets 82a, 82b, 82c, 82d are first electromagnets 81a, 81b, 81c, 81d which may be referred as first stator windings. Similarly arranged around the second permanent magnets 84a, 84b, 84c, 84d are second electromagnets 83a, 83b, 83c, 83d which may be referred as second stator windings. The first and second stator windings are wound along cores extending in the radial directions of the shaft 80 as a center, as shown in FIG. 12.

Figure 11:
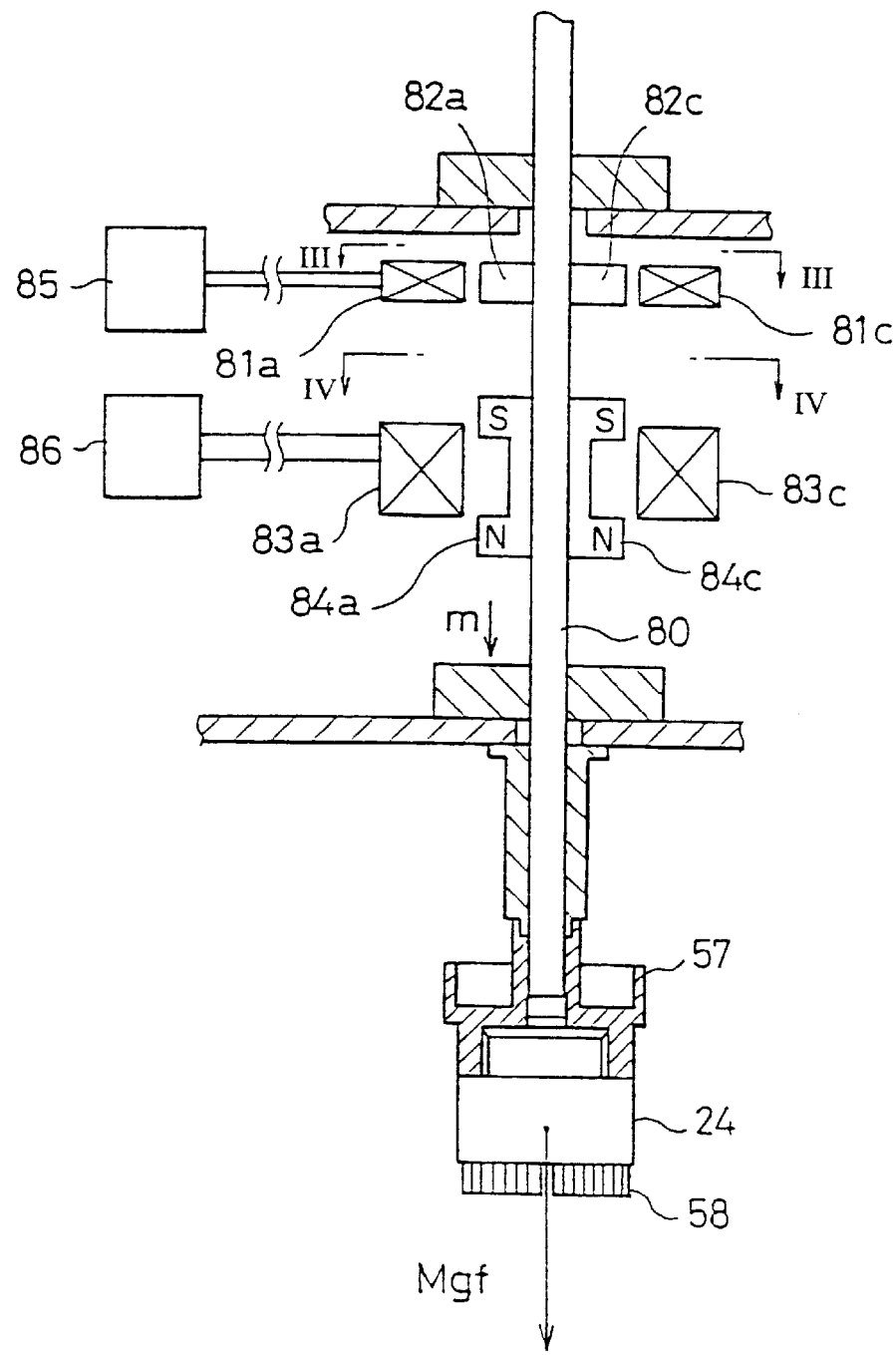
FIG. 11 is a side view for explanation of another constitution of the driving unit of the surface treatment device.

FIG. 12 is a cross sectional view taken along line III—III of FIG. 11. As shown in FIG. 12, the first permanent magnets 82a to 82d are secured on the circumference of the shaft 80 at angular intervals of 90 degrees, as the center of the shaft 80. In the example shown in FIG. 12, the first stator winding 81a is opposed to the first permanent magnet 82a, while the first stator winding 81b is opposed to the first permanent magnet 82b. Similarly, the first stator winding 81c is opposed to the first permanent magnet 82c, while the first stator winding 81d is opposed to the first permanent magnet 82d.

Again, as shown in FIG. 11, the first stator windings 81*a* to 81*d* have the power control unit 85 connected thereto in common. The current supply from the power control unit 85 allows the first stator windings 81*a* to 81*d* to generate magnetic fields. Here, if the magnetic poles of the first permanent magnets 82*a* to 82*d* are respectively different from those of the first stator windings 81*a* to 81*d* in terms of polarity, then attractive forces will be produced therebetween, so that there will be produced a force for retaining the permanent magnets 82*a* to 82*d* within the limits of designated heights. Therefore, when the power control unit 85 varies the current to adjust the field intensity due to the first stator windings 81*a* to 81*d*, then it is possible to control the retaining force acting on the first permanent magnets 82*a* to 82*d* at will.

FIG. 13 is a cross sectional view taken along a line IV—IV of FIG. 11. FIG. 13 shows the second permanent magnets 84*a* to 84*d* being attached to the periphery of the shaft 80 as the center, at angular intervals of 90 degrees in the circumferential direction. Especially shown in FIG. 11, the second permanent magnets 84*a* to 84*d* are formed to have general C-shaped configurations, so that the respective upper portions are different from the respective lower portions in terms of polarity. In the example shown in FIG. 13, the second stator winding 83*a* is opposed to the second permanent magnet 84*a*, while the second stator winding 83*b* is opposed to the second permanent magnet 84*b*. Similarly, the second stator winding 83*c* is opposed to the second permanent magnet 84*c*, while the second stator winding 83*d* is opposed to the second permanent magnet 84*d*. As shown in FIG. 11, the second stator windings 83*a* to 83*d* have the power control unit 86 connected thereto in common, so that the current supply from the power control unit 86 allows the second stator windings 83*a* to 83*d* to generate magnetic fields.

Under the situation, the electricity is supplied to the second stator windings 83*a* to 83*d* so that the polarities of respective poles formed by the second stator windings 83*a* to 83*d* are different from the polarities of respective poles formed by the upper portions of the second permanent magnets 84*a* to 84*d*, while the polarities of respective poles formed by the second stator windings 83*a* to 83*d* are identical to the polarities of respective poles formed by the lower portions of the second permanent magnets 84*a* to 84*d*, respectively. Consequently, there are respectively produced attractive forces between the second stator windings 83*a* to 83*d* and the upper portions of the second permanent magnets 84*a* to 84*d*, while the forces of repulsion are produced between the second stator windings 83*a* to 83*d* and the lower portions of the second permanent magnets 84*a* to 84*d*, respectively.

Accordingly, after being lowered by a movement distance (m), the shaft 80 fixed on the second magnets 84*a* to 84*d* is maintained at a designated height by the retaining force equal to the sum of or the difference between: an attractive force between the upper poles of the second permanent magnets 84*a* to 84*d* and the poles of the second stator windings 83*a* to 83*d* and an attractive force between the first permanent magnets 82*a* to 82*d* and the first stator windings 81*a* to 81*d*.

Therefore, when the power control unit 86 varies the current to adjust the field intensity due to the first stator windings 83*a* to 83*d*, then it is possible to control the downward thrust acting on the second permanent magnets 84*a* to 84*d* at will. Additionally, as shown in FIG. 9, it is preferable to connect the measuring sensor 50 with the power control units 85, 86.

Alternatively, if the first stator windings 81*a* to 81*d* generate an alternating field to apply the rotating force on the first permanent magnets 82*a* to 82*d*, then it is also possible to rotate the processing member. In other words, the first stator windings 81*a* to 81*d* and the first permanent magnets 82*a* to 82*d* are can be used as a rotational motor, i.e., a rotational driving source. With the structure mentioned above, it is also possible to simplify the components.

Next, we describe a method of controlling the contact pressure of the processing member 24 by its height adjustment in case of execute the scrubbing while using the above-mentioned drive unit 79. First of all, it is executed to allow the power control unit 85 to supply the current to the first stator windings 81*a* to 81*d* in a manner that the retaining force more than the weight (M) gf of the processing member 24 acts on the first permanent magnets 82*a* to 82*d*. Consequently, owing to the formation of magnetic field by the first stator windings 81*a* to 81*d*, the first permanent magnets 82*a* to 82*d* are maintained at a designated height.

While, it is also carried out to allow the power control unit 86 to supply the current to the second stator windings 83*a* to 83*d* in a manner that the downward thrust acts on the second permanent magnets 84*a* to 84*d*. In this way, the shaft 80 is lowered by the movement distance (m).

Thereafter, the shaft 80 is maintained at a designated height by the attractive force between the first permanent magnets 82*a* to 82*d* and the first stator windings 81*a* to 81*d* and the attractive force between the second stator windings 83*a* to 83*d* and the second permanent magnets 84*a* to 84*d*. Consequently, the height of the processing member 24 is determined to apply the predetermined contact pressure on the surface of the wafer W. Also in this case, the advanced calculation of the height of the processing member 24 for realizing the designated contact pressure would the actual contact pressure of the processing member 24 to be controlled accurately, during the actual scrubbing process.

Figure 14:
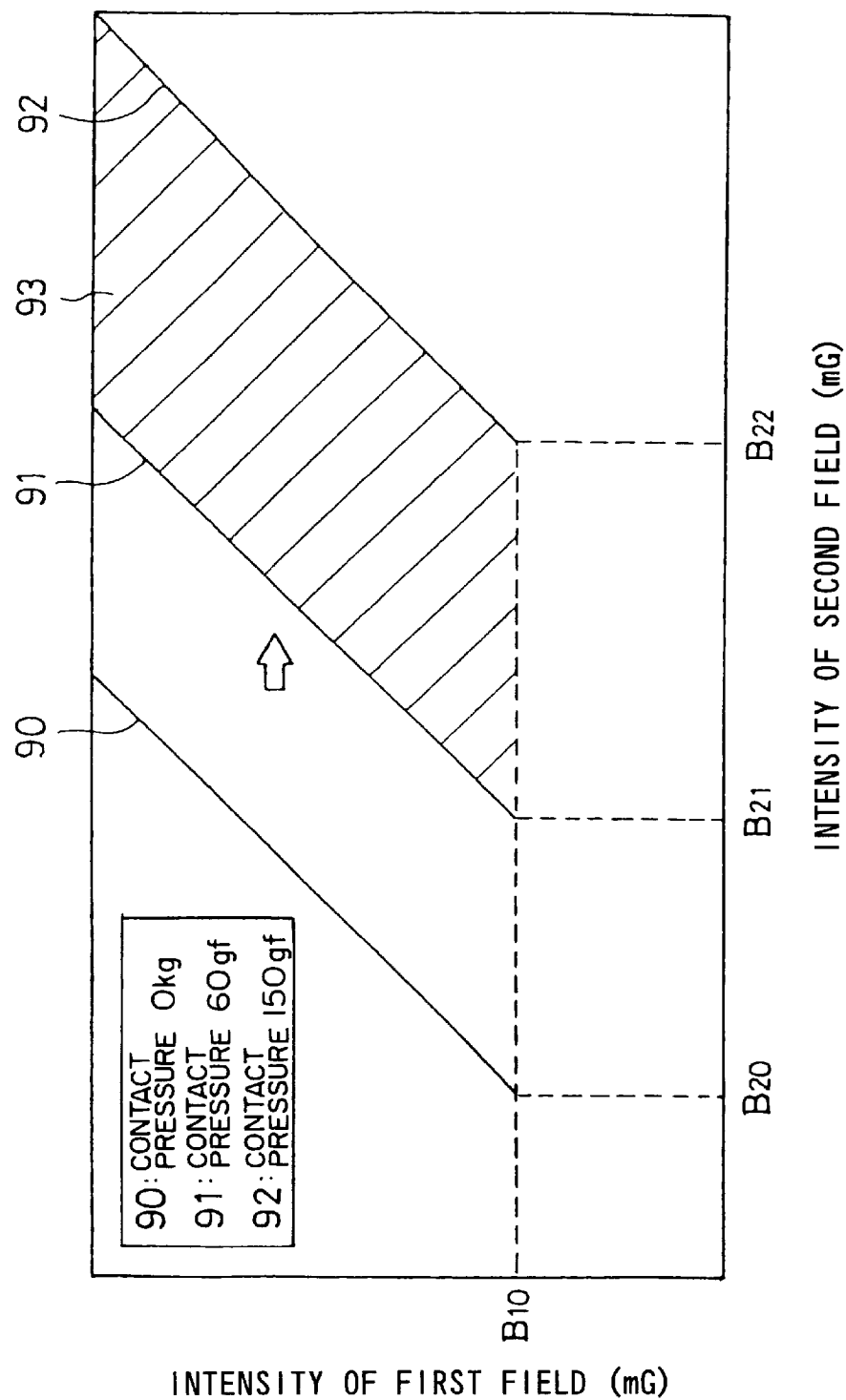
FIG. 14 is a graph diagram showing a relationship between a first field intensity by a first stator winding and a second field intensity by a second stator winding.

Next, referring to FIG. 14, we describe the control method of the contact pressure of the processing member 24, in connection with the field intensity of the first stator windings 81*a* to 81*d* and the second stator windings 83*a* to 83*d*. In FIG. 14, the vertical axis denotes a first field intensity [mG (milligauss)] appearing by the magnetic field due to the first stator windings 81*a* to 81*d*, while the horizontal axis denotes a second field intensity [mG] appearing by the magnetic field due to the second stator windings 83*a* to 83*d*.

Graphic lines 90, 91, 92 in FIG. 14 show respective relationships between the first field intensity and the second field intensity in adjusting the contact pressure to 0 gf, 60 gf and 90 gf, respectively. For example, in order to bring the contact pressure of the processing member 24 within the range from 60 gf to 150 gf, the first and second field intensities have only to be adjusted within an area 93 with oblique lines, interposed between the graphic line 91 and the graphic line 92.

Whether the processing member 24 can be ensurely fixed at the designated height is determined by the mutual relationship in retaining force between the first permanent magnets 82*a* to 82*d* and the second permanent magnets 84*a* to 84*d*. Thus, as shown in FIG. 14, unless the first field intensity is more than B20, it is impossible to maintain the first permanent magnets 82*a* to 82*d* since the retaining force acting on the first permanent magnets 82*a* to 82*d* does not become more than the weight of the processing member 24.

Regarding the lines 90, 91, 92 in FIG. 14, in the neighborhood of respective intersections between the lines B10 and B20, the lines B10 and B21 and the lines B10 and B22, each retaining force on the first permanent magnets 82*a* to 82d is substantially equal to the weight of the processing member 24. Then, it appears such a condition as if the shaft 80 is supported by a spring. In this case, it is preferable to carry out the scrubbing while causing the processing member 24 to rotating at low speed and contact with the back surface of the wafer W so that the shaft 80 absorbs both reaction and vibration that the processing member 24 does suffer.

On the other hand, it should be noted that, in all lines 90, 91 and 92, when increasing the field intensities of the first stator windings 81a to 81d and the second stator windings 83a to 83d along the lines, then the retaining force acting on the first permanent magnets 82a to 82d and the second permanent magnets 84a to 84d sufficiently exceeds the weight of the processing member 24. Therefore, it is possible to securely fix the processing member 24 at the designated height while keeping the contact pressure of the processing member 24 at 0 gf, 60 gf and 150 gf, respectively. In this case, it is preferable to carry out the scrubbing where, for example, the processing member 24 rotating at high speed comes into contact with the surface of the wafer W without shifting the height of the unit 24 an inch.

Note, the contact pressure of the processing member 24 depends on the relationship between the first field intensity and the second field intensity. In the shown example, the more the graphic line does shift to the right hand, the more the second field intensity increases relatively to the first field intensity. Consequently, due to the extension of the moving distance (m) of the shaft 80, the processing member 24 is pushed down, so that the contact pressure of the unit 24 increases. Thus, in the area 93, the more it approaches the upside, the larger the retaining force acting on the first permanent magnets 82a to 82d and the second permanent magnets 84a to 84d is getting. Similarly, the more it approaches the right, the larger the contact pressure of the processing member 24 gets. Therefore, when freely adjusting the first and second field intensities in the area 93 in accordance with the object and application of the scrubbing, then it is possible to accomplish the scrubbing appropriately.

Further providing that the upper portions of the second permanent magnets 84a to 84d are respectively identical to the second stator windings 83a to 83d in terms of polarity thereby to produce the force of repulsion therebetween while the lower portions of the second permanent magnets 84a to 84d are respectively different from the second stator windings 83a to 83d in polarity thereby to produce the attractive force therebetween, then the second permanent magnets 84a to 84d are subjected to the upward thrusts. Further, when moves the second permanent magnets 84a to 84d up and down by changing the respective polarities of the second stator windings 83a to 83d, it becomes possible to fine adjust the vertical thrust applied on the shaft 80 through the second permanent magnets 84a to 84d. In this case, the adoption of the measuring sensor 50 would allow the contact pressure of the processing member 24 to be controlled. It is noted that although the magnetic field is produced perpendicularly to the shaft 80 in the second embodiment, the invention is not limited to this arrangement and therefore, the filed may be generated at a different angle.

In the above-mentioned embodiments, the substrates as the object to be cleaned are performed by the wafers W; nevertheless the substrates may be LCD substrates, glass substrates, CD substrates, photomasks, printed boards, ceramic boards, etc. Finally, it will be understood by those skilled in the art that the foregoing description is related to some preferred embodiments of the processing apparatus and that various changes and modifications may be made to the present invention without departing from the spirit and scope thereof.

What is claimed is:

1. A processing apparatus comprising:
    an arm member having a proximal end and a distal end;
    a processing member for applying a designated treatment on a substrate; and
    a drive unit fixed to the arm member for driving the processing member, the drive unit including a motor for driving the processing member for rotation about a predetermined axis as a rotating center and an adjustment mechanism for controlling a force exerted on the substrate by the processing member, wherein the drive unit is disposed at the distal end of the arm member, and the motor and the adjustment mechanism are combined with each other.

2. The processing apparatus according to claim 1, further comprising an operating mechanism for moving the arm member arranged at the proximal end of the arm member.

3. The processing apparatus according to claim 1, wherein the adjustment mechanism includes a stationary element fixed to the arm member and a movable element capable of moving in a direction of the axis of the processing member relative to the stationary element, wherein the motor is fixed to the movable element of the adjustment mechanism, and wherein the processing member is connected to the motor so that the processing member is moved in the direction of the axis when the adjustment mechanism operates.

4. The processing apparatus according to claim 3, wherein the adjustment mechanism is constituted by an electromagnetic linear actuator.

5. The processing apparatus according to claim 3, wherein the processing member is connected to the motor via a shaft.

6. The processing apparatus according to claim 1, wherein the motor is disposed above the processing member with respect to a vertical direction.

7. The processing apparatus according to claim 1, wherein the motor has an output shaft and the axis of the processing member and an axis of the output shaft of the motor are aligned with each other.

8. The processing apparatus according to claim 1, wherein the drive unit further includes a guide mechanism for guiding the motor along the axis of the processing member.

9. The processing apparatus according to claim 1, wherein the drive unit further includes a casing having an interior space for accommodating the motor and the adjustment mechanism, said processing apparatus further comprising an exhaust mechanism for discharging atmosphere filling the interior space of the casing.

10. A processing apparatus comprising:
    a processing member for applying a designated treatment on a substrate;
    a motor for driving the processing member for rotation about a predetermined axis as a rotating center; and
    an adjustment mechanism for controlling a force exerted on the substrate by the processing member;
    wherein the adjustment mechanism includes a stationary element and a movable element, wherein the motor is fixed to the movable element, and wherein the movable element, the motor and the processing member are combined with each other so as to move together.

11. The processing apparatus according to claim 10 further comprising an arm member having a proximal end and a distal end, the arm member being rotatable about an axis as a rotating center, the rotating center of the arm member being positioned at the proximal end,
    wherein the stationary element of the adjustment mechanism is fixed to the arm member thereof.

12. A processing apparatus comprising:
   a processing member for applying a designated treatment on a substrate; and
   a drive unit for driving the processing member, the drive unit including:
   a drive shaft for rotating the processing member, the drive shaft being movable upward and downward;
   first magnets secured on the drive shaft;
   second magnets secured on the drive shaft;
   first electromagnets arranged in the vicinity of the first magnets, for maintaining the drive shaft at a predetermined height due to electromagnetic force acting between the first magnet and the first electromagnet; and
   second electromagnets arranged in the vicinity of the second magnet, for moving the driving shaft in an axial direction thereof due to electromagnetic force acting between the second magnets and the second electromagnet.

13. The processing apparatus according to claim 12, wherein the first magnets are arranged in the circumferential direction of an axis of the drive shaft for rotation as a center, and wherein the first electromagnets are arranged so as to surround the first magnets in the circumferential direction of the axis of the drive shaft for rotation as a center, said processing apparatus further comprising a conduction control part for controlling a conductive pattern of the first electromagnet thereby to rotate the drive shaft.

14. The processing apparatus according to claim 12 further comprising a motor connected to the drive shaft for rotationally driving the drive shaft.

15. A processing apparatus comprising:
   a processing member for applying a designated treatment on a substrate;
   a motor for rotationally driving the processing member;
   a shaft for connecting the motor to the processing member;
   elevating means for moving up and down the processing member, the motor and the shaft together.

16. The processing apparatus according to claim 15 further comprising:
   means for supporting a substrate;
   a mechanism for rotating the supporting means; and
   means for supplying a process liquid to the substrate.

* * * * *